US006866958B2

(12) United States Patent
Vyas et al.

(10) Patent No.: US 6,866,958 B2
(45) Date of Patent: Mar. 15, 2005

(54) ULTRA-LOW LOADINGS OF AU FOR STAINLESS STEEL BIPOLAR PLATES

(75) Inventors: Gayatri Vyas, Rochester Hills, MI (US); Yang-Tse Cheng, Rochester Hills, MI (US); Mahmoud H. Abd Elhamid, Warren, MI (US); Youssef M. Mikhail, Sterling Heights, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/163,393

(22) Filed: Jun. 5, 2002

(65) Prior Publication Data

US 2003/0228512 A1 Dec. 11, 2003

(51) Int. Cl.[7] .................................................. H01M 8/10
(52) U.S. Cl. ........................................ 429/38; 429/39
(58) Field of Search ...................... 429/38–39; 427/573, 427/574, 577, 579; 428/209, 210, 408, 701, 702

(56) References Cited

U.S. PATENT DOCUMENTS

| 4,519,065 | A | * | 5/1985 | Lewis et al. ............. 369/275.1 |
| 4,973,358 | A | | 11/1990 | Jin et al. |
| 5,036,252 | A | * | 7/1991 | Lob ....................... 315/111.31 |
| 5,086,035 | A | * | 2/1992 | Hung et al. .................. 505/232 |
| 5,554,178 | A | * | 9/1996 | Dahl et al. ................... 607/122 |
| 5,726,524 | A | * | 3/1998 | Debe ........................... 313/309 |
| 5,786,068 | A | * | 7/1998 | Dorfman et al. ............ 428/209 |
| 5,888,593 | A | * | 3/1999 | Petrmichl et al. ........... 427/563 |
| 6,051,117 | A | * | 4/2000 | Novak et al. ................ 204/252 |
| 6,096,450 | A | | 8/2000 | Walsh |
| 6,103,413 | A | | 8/2000 | Hinton et al. |
| 6,248,467 | B1 | | 6/2001 | Wilson et al. |
| RE37,284 | E | | 7/2001 | Li et al. |
| 6,335,120 | B1 | * | 1/2002 | Bernard et al. ............. 429/223 |
| 6,350,539 | B1 | * | 2/2002 | Wood et al. .................. 429/34 |
| 6,426,863 | B1 | * | 7/2002 | Munshi ....................... 361/503 |
| 6,649,030 | B1 | * | 11/2003 | Tesar ..................... 204/192.14 |
| 2002/0081478 | A1 | * | 6/2002 | Busenbender ................ 429/34 |
| 2002/0086197 | A1 | * | 7/2002 | Breuer et al. ................. 429/34 |

OTHER PUBLICATIONS

Notification of Transmittal Of The International Search Report Or The Declaration, dated Aug. 5, 2003.
Patent Application entitiled "Low Contact Resistance PEM Fuel Cell", U.S. Appl. No. 09/997,190, filed Nov. 20, 2001.
Yang–Tse Cheng, et al., "Vapor Deposited Thin Gold Coatings for High Temperature Electrical Contacts," 1996 IEEE, pp. 404–413.
R. Hornung, et al., "Bipolar Plate Materials Development Using Fe–Based Alloys for Solid Polymer Fuel Cells," Journal of Power Sources 72 (1998) 20–21.

* cited by examiner

*Primary Examiner*—Frankie L. Stinson
*Assistant Examiner*—Monique Wills
(74) *Attorney, Agent, or Firm*—Harness, Dickey & Pierce, P.L.C.

(57) ABSTRACT

An electrically conductive fluid distribution element for a fuel cell which comprises an electrically conductive substrate, a flow field for distributing fluid along a surface of the substrate, and an electrically conductive coating on the surface which comprises a noble metal, desirably Ru, Rh, Pd, Ag, Ir, Pt, Os, and preferably Au.

27 Claims, 15 Drawing Sheets

Figure10a: SEM Micrograph of 10nm Ion-beam modified Au (50X Mag)
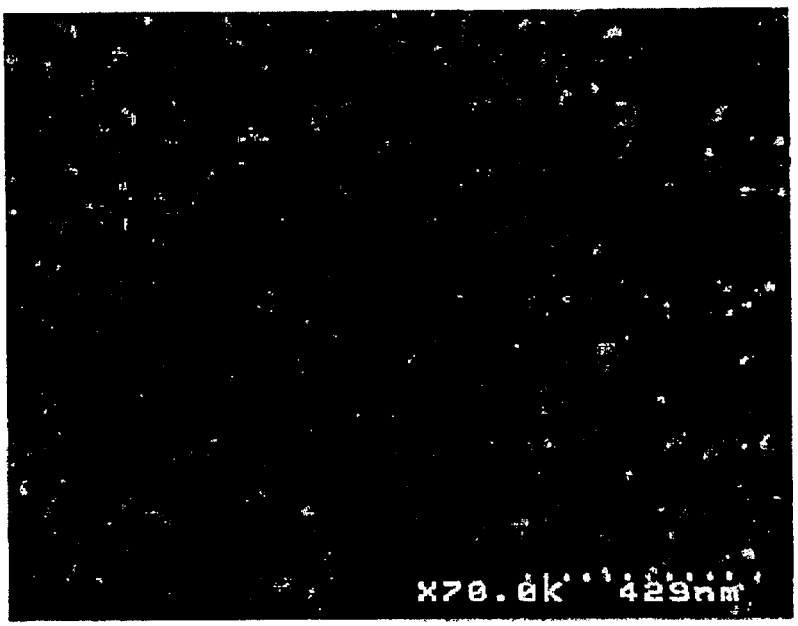
Figure10b (PRIOR ART): SEM Micrograph of 100nm Electroplated Au with Ni interlayer (70X Mag)

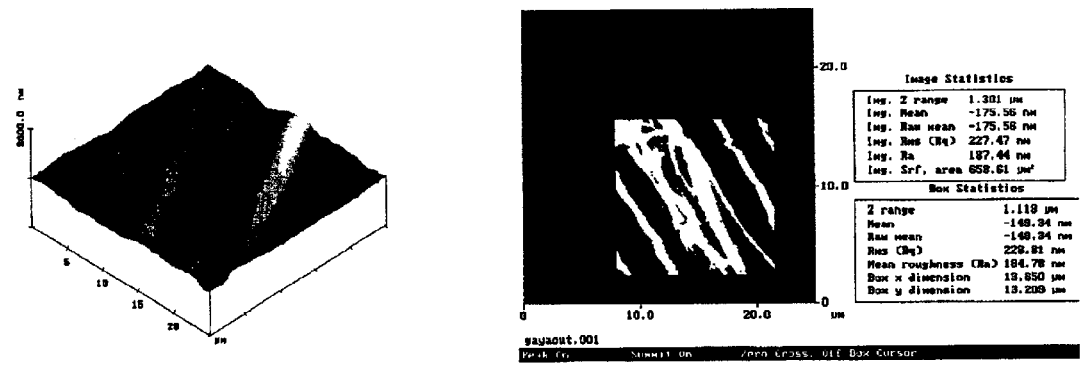
Figure 11a: AFM images of the Ion beam modified Au with calculated roughness
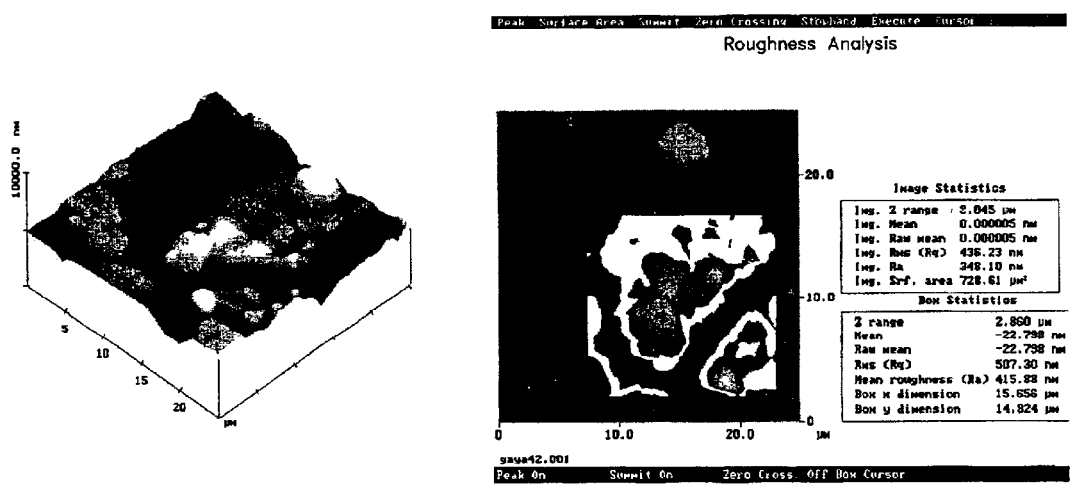
Figure 11b (PRIOR ART): AFM images of electroplated samples and calculated roughness

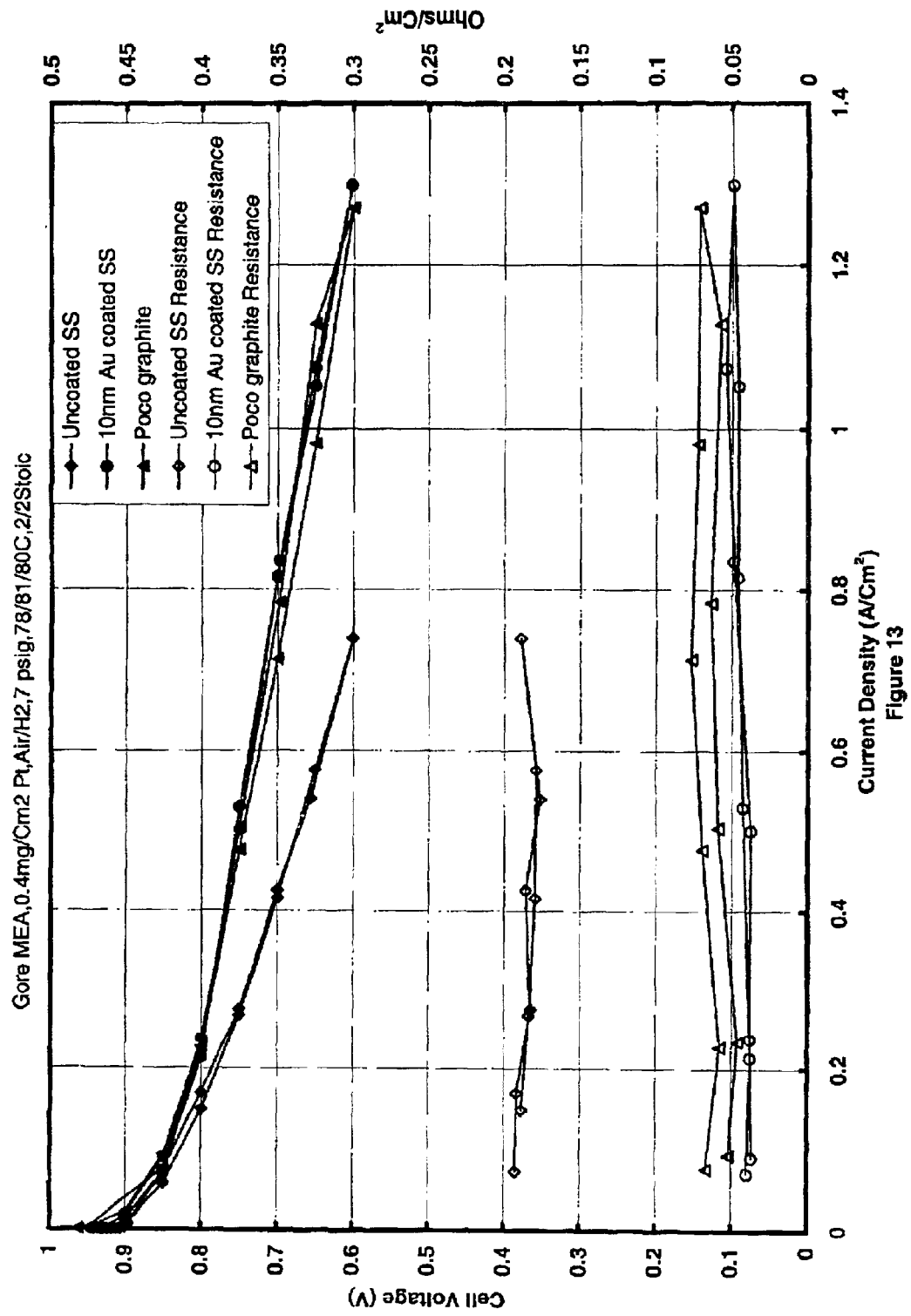

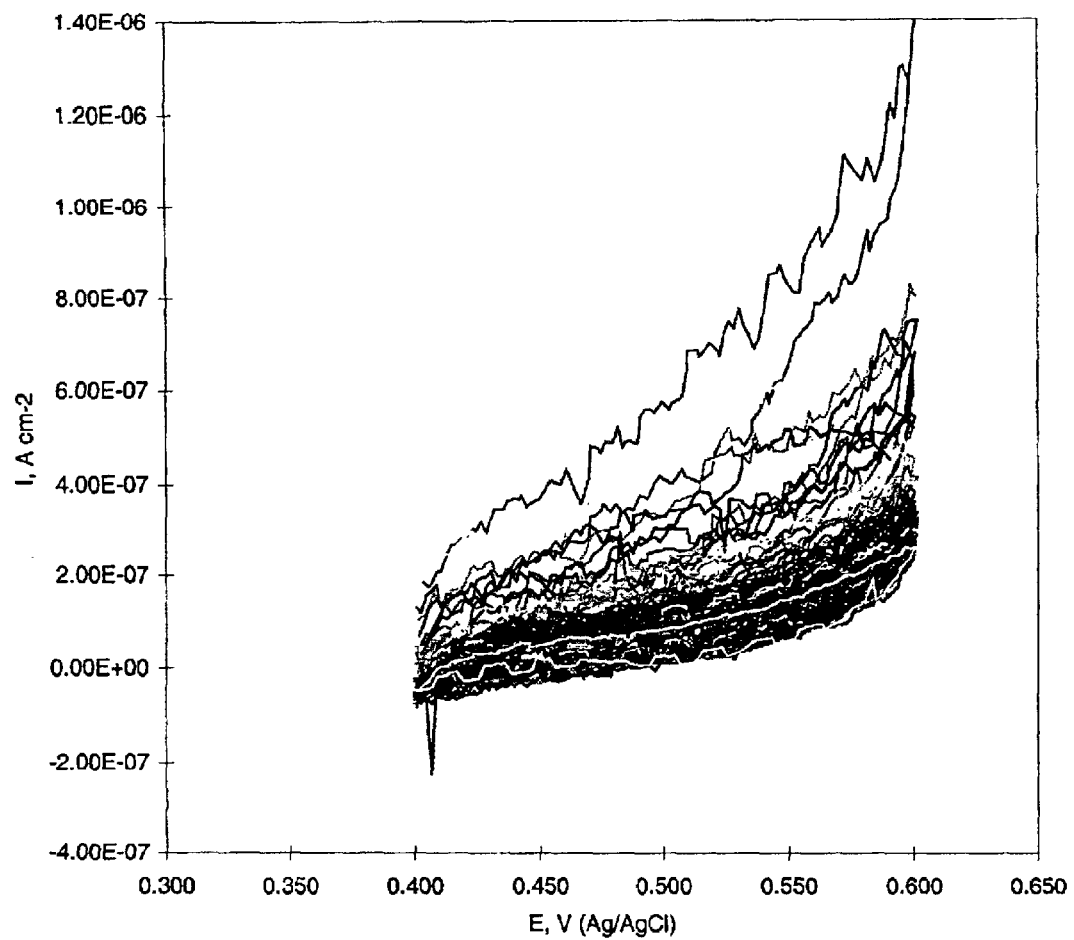
Fig.14: A Sum of 50 cycles obtained on stainless steel coated with 10nm of gold, obtained in an aerated simulated fuel cell solution and operated at 80°C at potential scan rate was 1mV/s.

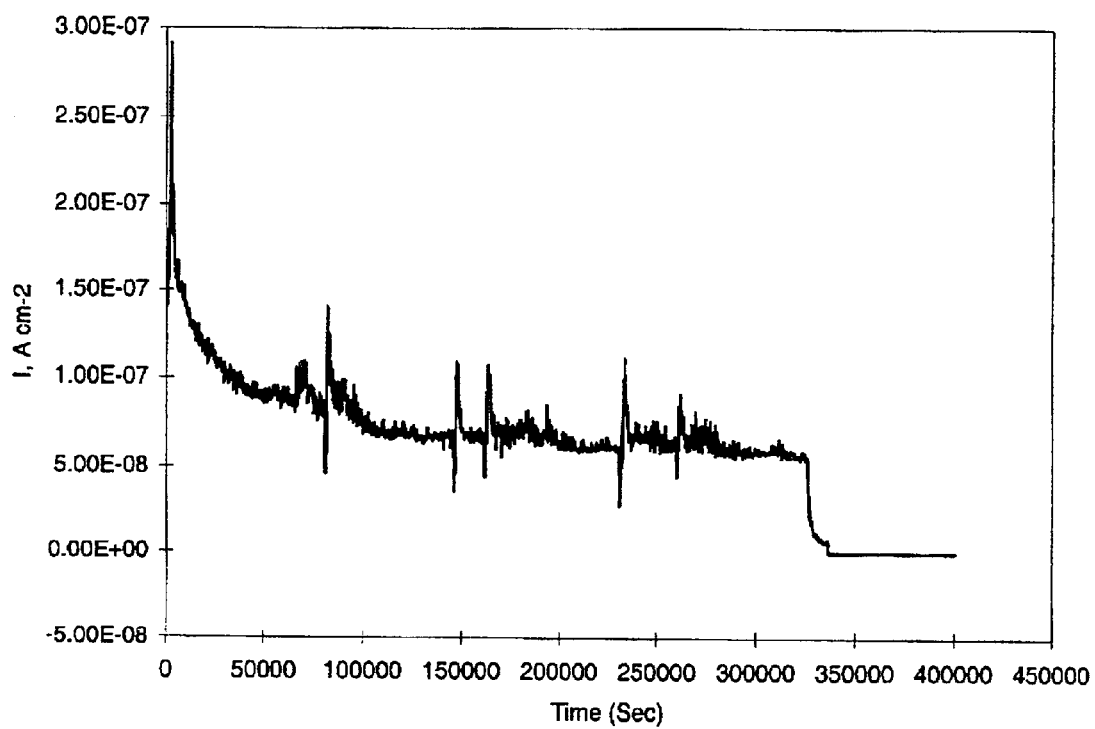
Fig.15: A potentiostatic transient obtained on a 316ss sample that was coated with 10nm of gold at an applied potential of +0.6V (Ag/AgCl) in an aerated simulated fuel cell solution operated at 80°C.

ULTRA-LOW LOADINGS OF AU FOR STAINLESS STEEL BIPOLAR PLATES

FIELD OF THE INVENTION

The present invention relates to fuel cells, and more particularly to electrically conductive fluid distribution elements and the manufacture thereof, for such fuel cells.

BACKGROUND OF THE INVENTION

Fuel cells have been proposed as a power source for electric vehicles and other applications. One known fuel cell is the proton exchange membrane (PEM) fuel cell that includes a so-called "membrane electrode assembly" comprising a thin, solid polymer membrane-electrolyte having an anode on one face of the membrane electrolyte and a cathode on the opposite face of the membrane-electrolyte. The membrane electrode assembly is sandwiched between a pair of electrically conductive fluid distribution elements which serve as current collectors for the anode and cathode. Flow fields are provided for distributing the fuel cell's gaseous reactants over surfaces of the respective anode and cathode. The electrically conductive fluid distribution elements may themselves form a part of the flow field in the form of appropriate channels and openings therein for distributing the fuel cell's gaseous reactants (i.e. $H_2$ and $O_2$) over the surfaces of the respective anode and cathode.

A fuel cell stack comprises a plurality of the membrane electrode assemblies stacked together in electrical series. The membrane electrode assemblies are separated from one another by the impermeable, electrically conductive fluid distribution elements, also known as a bipolar plates. The bipolar plate has two major surfaces, one facing the anode of one cell and the other surface facing the cathode on the next adjacent cell in the stack. The plate electrically conducts current between the adjacent cells. Contact elements at the ends of the stack contact only the end cells and are referred to as end plates.

In a PEM fuel cell environment that employs $H_2$ and $O_2$ (optionally air), the bipolar plates and other contact elements (e.g. end plates) are in constant contact with acidic solutions (pH 3–5) and operate at elevated temperatures on the order of 60 degrees centigrade to 100 degrees centigrade. Moreover, the cathode operates in a highly oxidizing environment while being exposed to pressurized air. The anode is constantly exposed to a harsh environment of pressurized hydrogen. Hence, many of the conventional contact elements are made from metal and must be resistant to acids, oxidation, and hydrogen embrittlement in the fuel cell environment. Metals which meet this criteria, however, are costly.

Lightweight metals such as aluminum and titanium and their alloys, as well as stainless steel, have been proposed for use in making fuel cell bipolar plates. Such metals are more conductive, and can be formed into very thin plates. Unfortunately, such lightweight metals are susceptible to corrosion in the hostile fuel cell environment, and bipolar plates made therefrom either dissolve (e.g. in the case of aluminum), or form a highly electronically resistive, passivating oxide film on their surface (e.g. in the case of titanium, stainless steel and aluminum) that increases the internal resistance of the fuel cell and reduces its performance. To address this problem, it has been proposed to coat the lightweight metal bipolar plates with a combination of layers which are both electrically conductive and corrosion resistant to thereby protect the underlying metal. See for example Li et al., RE 37,284 E, assigned to the assignee of the present invention.

These layered coatings, however, are expensive due to the thickness that needs to be deposited onto the plates in order to protect from corrosion. Another drawback is that these thick layers degrade when subjected to high stack compression pressures, thereby decreasing the corrosion resistance.

It is desirable, therefore, for a bipolar plate to be manufactured easily and inexpensively that is corrosion resistant and has a high degree of conductivity.

SUMMARY OF THE INVENTION

The present invention provides an electrically conductive fluid distribution element for a fuel cell which comprises an electrically conductive substrate having first and second major surfaces, a flow field at the first surface for distributing fluid along the first surface, and an electrically conductive coating on the first surface which comprises a noble metal or a compound containing a noble metal. Desirably, the noble metal is selected from Ru, Rh, Pd, Ag, Ir, Pt, and Os, and preferably Au; and mixtures thereof.

The coating is relatively thin, having a thickness less than 100 nm, desirably less than 80 nm, more desirably less than 50 nm, preferably 20 nm and most preferably in a range of 10 to 20 nm. The coating is also preferably relatively smooth as applied by ion-beam assisted physical vapor deposition.

The present invention also provides a method of ion-beam assisted, physical vapor deposition, for coating the electrically conductive fluid distribution element with the conductive coating of noble metal.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 10a and 10b are comparisons of coatings produced by an ion-assisted, physical vapor deposition method and an electroplating method;

FIGS. 11a and 11b are Atomic Force Microscopy images and roughness analyses comparing coatings produced by an ion-assisted, physical vapor deposition method and an electroplating method;

FIG. 13 is a polarization graph portraying cell voltage versus current density and contact resistance achieved by an electrically conductive coating on stainless steel of the present invention in comparison to an uncoated stainless steel substrate and Poco graphite;

FIG. 14 is a graph portraying corrosion currents while cycling the potential between +0.4 and +0.6 V (vs. Ag/AgCl) in aerated solution at 80 degrees centigrade; and FIG. 15 is a graph portraying a potentiostatic transient of a stainless steel sample coated with 10 nm of gold at an applied potential of +0.6 V (Ag/AgCl) in an aerated simulated fuel cell solution operated at 80 degrees centigrade.

DETAILED DESCRIPTION OF THE PREFERRED EMBODIMENTS

The following description of the preferred embodiments is merely exemplary in nature and is in no way intended to limit the invention, its application, or uses.

Figure 1:
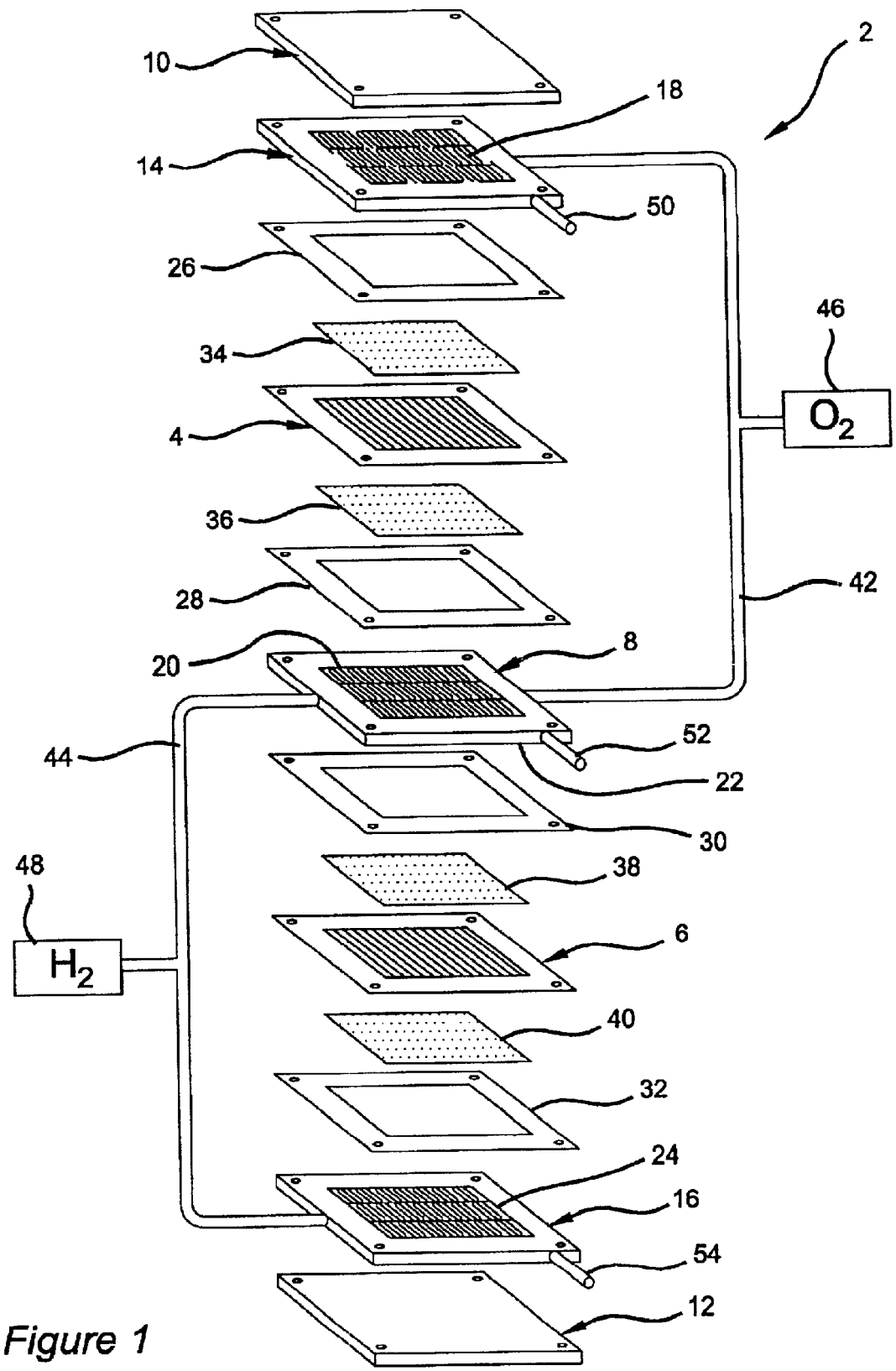
FIG. 1 is a schematic, exploded illustration of a PEM fuel cell stack (only two cells shown)

FIG. 1 depicts a two cell, bipolar fuel cell stack 2 having a pair of membrane-electrode-assemblies (MEAs) 4 and 6 separated from each other by an electrically conductive fluid distribution element 8, hereinafter bipolar plate 8. The MEAs 4 and 6 and bipolar plate 8, are stacked together between stainless steel clamping plates, or end plates 10 and 12, and end contact elements 14 and 16. The end contact elements 14 and 16, as well as both working faces of the bipolar plate 8, contain a plurality of grooves or channels 18, 20, 22, and 24, respectively, for distributing fuel and oxidant gases (i.e. $H_2$ and $O_2$) to the MEAs 4 and 6. Nonconductive gaskets 26, 28, 30, and 32 provide seals and electrical insulation between the several components of the fuel cell stack. Gas permeable conductive materials are typically carbon/graphite diffusion papers 34, 36, 38, and 40 that press up against the electrode faces of the MEAs 4 and 6. The end contact elements 14 and 16 press up against the carbon/graphite papers 34 and 40 respectively, while the bipolar plate 8 presses up against the carbon/graphite paper 36 on the anode face of MEA 4, and against carbon/graphite paper 38 on the cathode face of MEA 6. Oxygen is supplied to the cathode side of the fuel cell stack from storage tank 46 via appropriate supply plumbing 42, while hydrogen is supplied to the anode side of the fuel cell from storage tank 48, via appropriate supply plumbing 44. Alternatively, ambient air may be supplied to the cathode side as an oxygen source and hydrogen to the anode from a methanol or gasoline reformer, or the like. Exhaust plumbing (not shown) for both the $H_2$ and $O_2$ sides of the MEAs 4 and 6 will also be provided. Additional plumbing 50, 52, and 54 is provided for supplying liquid coolant to the bipolar plate 8 and end plates 14 and 16. Appropriate plumbing for exhausting coolant from the bipolar plate 8 and end plates 14 and 16 is also provided, but not shown.

Figure 2:
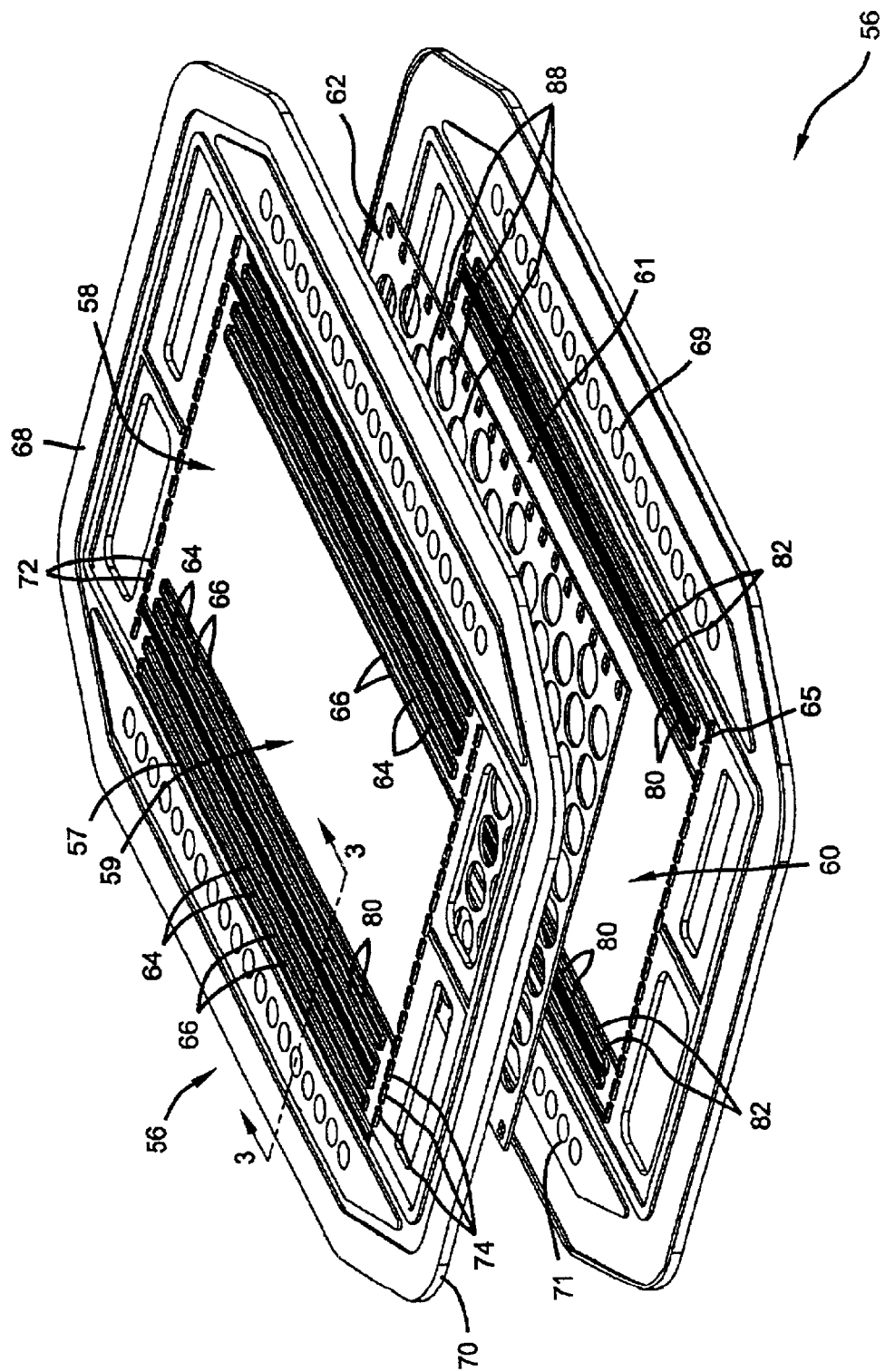
FIG. 2 is an exploded view of an exemplary electrically conductive fluid distribution element useful with PEM fuel cell stacks.
Figure 3:
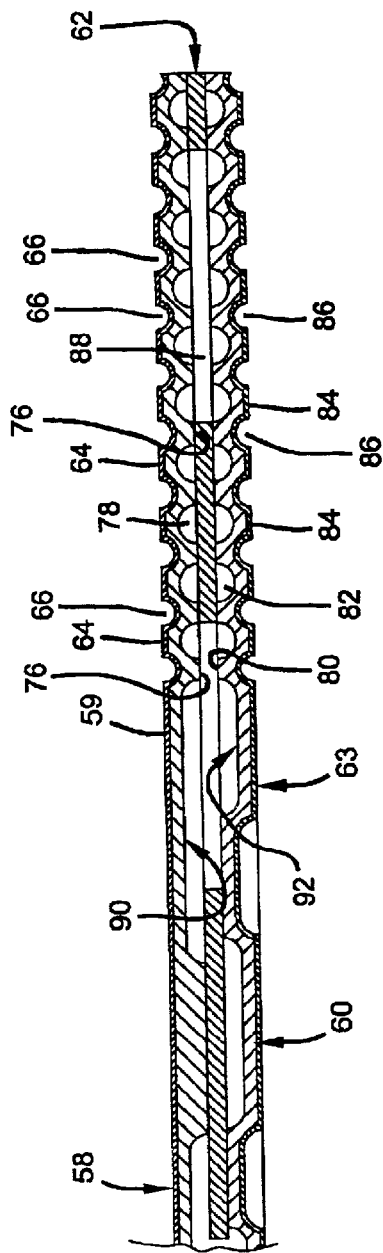
FIG. 3 is a sectional view in the direction of 3—3 of FIG. 2.

FIG. 2 is an exploded view of an exemplary bipolar plate 56 that may be used in accordance with a first embodiment of the present invention. The bipolar plate 56 comprises a first exterior metal sheet 58, a second exterior metal sheet 60, and an interior spacer metal sheet 62 interjacent the first metal sheet 58 and the second metal sheet 60. The exterior metal sheets 58 and 60 are made as thin as possible and may be formed by stamping, or any other conventional process for shaping sheet metal. The external sheet 58 has a first working face 59 on the outside thereof which confronts a membrane electrode assembly (not shown) and is formed so as to provide a flow field 57. The flow field 57 is defined by a plurality of lands 64 which define therebetween a plurality of grooves 66 which constitutes the "flow field" through which the fuel cell's reactant gases (i.e. $H_2$ or $O_2$) flow in a meandering path form one side 68 of the bipolar plate to the other side 70 thereof. When the fuel cell is fully assembled, the lands 64 press against the porous material, carbon/graphite papers 36 or 38 which, in turn, press against the MEAs 4 and 6. For simplicity, FIG. 2 depicts only two arrays of lands and grooves. In reality, the lands and grooves will cover the entire external faces of the metal sheets 58 and 60 that engage the carbon/graphite papers 36 and 38. The reactant gas is supplied to grooves 66 from a manifold 72 that lies along one side 68 of the fuel cell, and exits the grooves 66 via another manifold 74 that lies adjacent the opposite side 70 of the fuel cell. As best shown in FIG. 3, the underside of the sheet 58 includes a plurality of ridges 76 which define therebetween a plurality of channels 78 through which coolant passes during the operation of the fuel cell. As shown in FIG. 3, the coolant channel 78 underlies each land 64 while a reactant gas groove 66 underlies each ridge 76. Alternatively, the sheet 58 could be flat and the flow field formed in a separate sheet of material.

Metal sheet 60 is similar to sheet 58. The internal face 61 of sheet 60 is shown in FIG. 2. In this regard, there is depicted a plurality of ridges 80, defining therebetween, a plurality of channels 82 through which coolant flows from one side 69 of the bipolar plate to the other 71. Like sheet 58 and as best shown in FIG. 3, the external side of the sheet 60 has a working face 63. Sheet 60 is formed so as to provide a flow field 65. The flow field 65 is defined by a plurality of lands 84 thereon defining a plurality of grooves 86 which constitute the flow field 65 through which the reactant gases pass. An interior metal spacer sheet 62 is positioned interjacent the exterior sheets 58 and 60 and includes a plurality of apertures 88 therein to permit coolant to flow between the channels 82 in sheet 60 and the channels 78 in the sheet 58 thereby breaking laminar boundary layers and affording turbulence which enhances heat exchange with the inside faces 90 and 92 of the exterior sheets 58 and 60, respectively. Thus, channels 78 and 82 form respective coolant flow fields at the interior volume defined by sheets 58 and 60.

Figure 4:
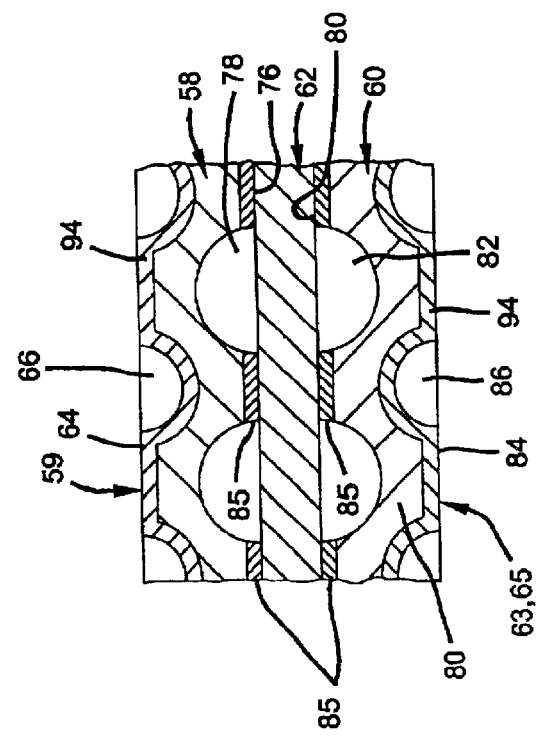
FIG. 4 is a magnified portion of the bipolar plate of FIG. 3.

FIG. 4 is a magnified view of a portion of FIG. 3 and shows the ridges 76 on the first sheet 58, and the ridges 80 on the second sheet 60 bonded by binder 85 to the spacer sheet 62.

In accordance with the present invention, and as best shown in FIG. 4, the working faces 59 and 63 of the bipolar plate are covered with an electrically conductive, oxidation resistant, and acid-resistant coating 94 comprising a noble metal selected from the group consisting of Rub, Rh, Pd, Ag, Ir, Au, Pt, and Os. The preferred coating is gold (Au). The thickness of the coating 94 is less than 80 nm, preferably less than 50 nm, and most preferably 10–20 nm. Optionally, the inside faces 90 and 92 of sheets 58 and 60 may also be covered with coating 94 (not shown).

Another option one skilled in the art would readily appreciate is to coat only the lands 64, 84 and not the grooves 66, 86 of sheets 58 and 60, respectively. Thus only adjacent electrically conductive surfaces in contact with one another are coated.

In a first embodiment, a metal substrate forming sheets 58 and 60 comprises a corrosion-susceptible metal such as aluminum, titanium, or stainless steel. The coating 94 is applied directly to the sheets 58 and 60.

Figure 5:
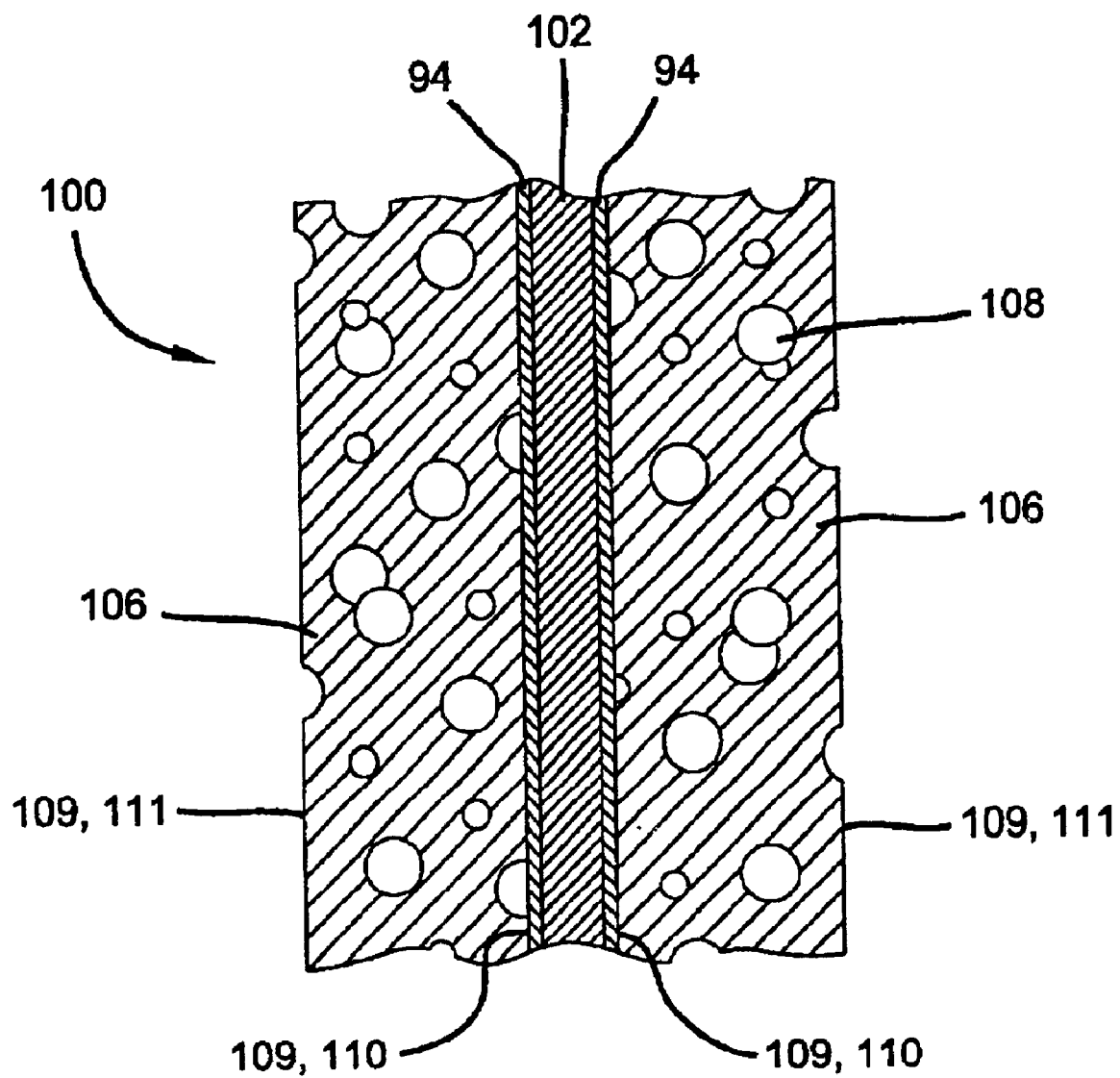
FIG. 5 is a partial cross-section of a bipolar plate that features a thin substrate with foamed metal flow fields attached to both sides of it.
Figure 6B:
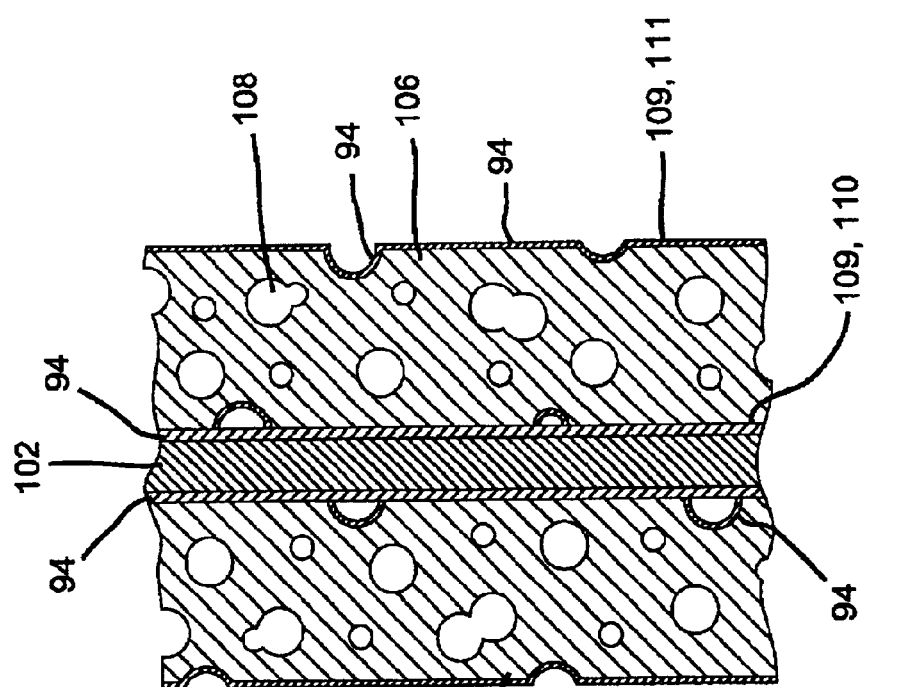
FIG. 6b is a partial cross-section of a bipolar plate as shown in FIG. 5 that has only the exterior surfaces of the foam coated with an electrically conductive material.
Figure 6A:
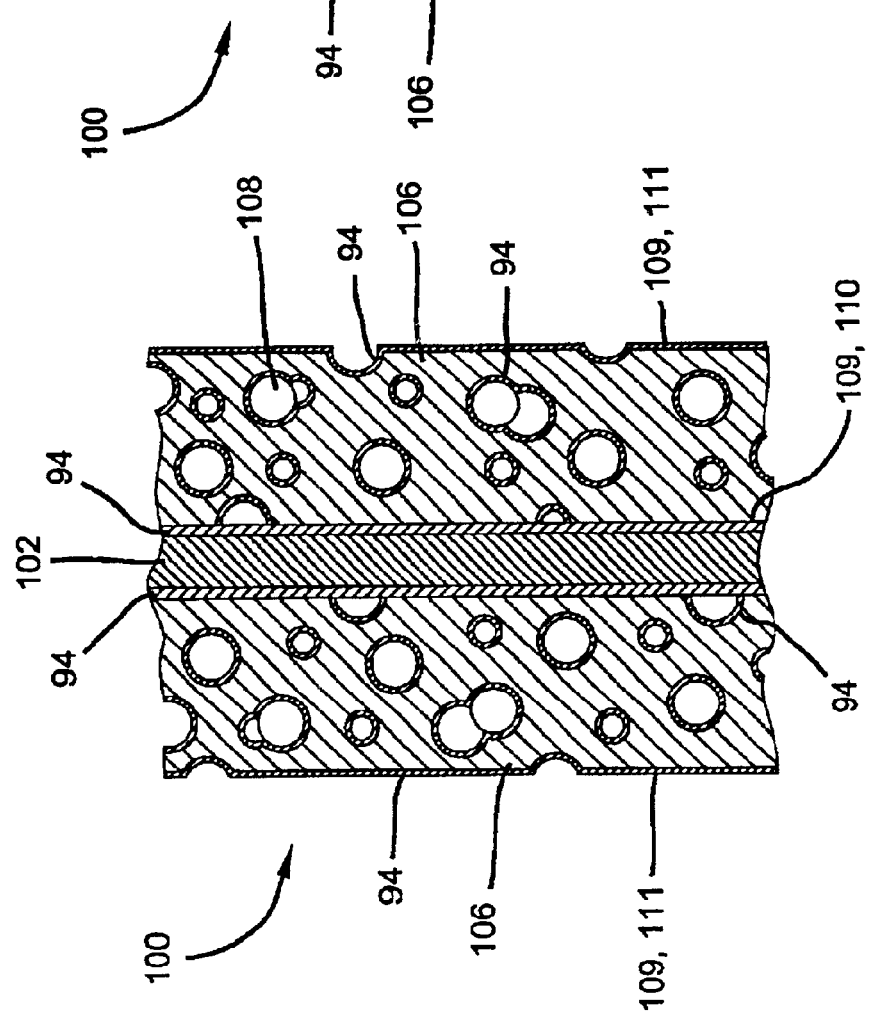
FIG. 6a is a partial cross-section of a bipolar plate as shown in FIG. 5, wherein the interior and exterior surfaces of the foam are coated with an electrically conductive material.

In a second embodiment, a cross-sectional view of another electrically conductive fluid distribution element 100 is shown in FIG. 5. The element 100 is constructed with a thin, substrate sheet 102 having foam flow fields 106. This bipolar plate features a thin barrier sheet 102, preferably made from a solid titanium metal sheet, with foam 106 (about one-half to about 3 millimeters thick) attached as by welding or brazing to both sides thereof. The sheet 102 forms the gas barrier and the foam 106 forms the fluid flow fields. As can be seen, foam 106 has opposed major surfaces 110 and 111. The foam 106 has one major surface 110 facing the metal sheet 102 and another major surface 111 opposite 110. Typically, major surface 111 faces the MEA. As shown in FIGS. 5 and 6, major surface 111 forms the outer surface of electrically conductive element 100. Foams can be prepared as metal foams or carbon-based foams. Metals that can be prepared as a solid foam include copper, aluminum, nickel, titanium, silver, and stainless steel, with the preferred metals being nickel and stainless steel. A variety of foamed metals are available from AstroMet, located in Cincinnati, Ohio. Methods for producing these metal foams are described in U.S. Pat. No. 4,973,358. Carbon-based foams are available from Ultra Met. In one aspect, the noble metal coating 94 is applied to the sheet 102 as shown in FIG. 5.

In other aspects of the second embodiment, the coating 94 of the substrate 102 and foam 106 vary depending on the characteristics of each of them. Depending on the material of construction and the arrangement of the substrate 102 and foam 106 it may be desirable to coat all of the surfaces of the substrate 102 when a metal sheet is used. In the case of metal foams there is the option to coat all of the internal and external surfaces of the foam 106, or the option to coat just some of the surfaces. It should be understood that the foam 106 being described herein is an open cell foam. This indicates that there are continuous flow paths or channels throughout the foam 106 created by contiguous openings, or pores, which are open to one another through the thickness of the foam 106. External surfaces 109 of the foam 106 refer to the aforesaid major surfaces such as 110 and 111 which include openings formed by surface pores. Internal surfaces of the foam are surfaces formed by the internal openings or pores 108 as shown in FIG. 5.

In an aspect of the second embodiment, it is possible to coat all of the internal openings 108, all of the external surfaces 109 of the foam 106 facing the MEA and facing the substrate planar sheet 102. (FIG. 6a) If a chemically unstable foam 106 such as aluminum or nickel were used, this would be desired. Optionally, the surfaces of the sheet 102 are coated. If a more chemically stable foam 106 such as stainless steel is used, the coating of internal and external surfaces of the foam 106 may not be necessary depending on the environment of the cell. In this case, the foam interior may remain uncoated or be coated to a given depth. Preferably, the coating 94 is applied to the parts of the foam 106 which are required to transfer electrons from one medium to the next, for example, from the foam surface 111 to the MEA or from the foam surface 110 to the planar sheet 102. As can be seen, in this embodiment (FIG. 6b), the coating 94 is applied to the electrically conductive element 100 where electrons flow into and out from the structure of the electrically conductive element 100. Once electrons are flowing through the structure of the element 100, i.e., the foam 106, there is no resistance within the foam 106 and the next encountered region of resistance is met where the electrons exit the foam 106 toward or at the surface of the metal sheet 102. In this embodiment, the coating 94 is applied to the major surface 111 of the foam 106 to a depth level of less than 80 nm, preferably less than 50 nm, and most preferably to a depth level of 10–20 nm. In addition in this embodiment it is desirable to also coat the foam 106 to a 10–20 nm depth level at major surface 110 where it faces the planar sheet metal 102.

Figure 7:
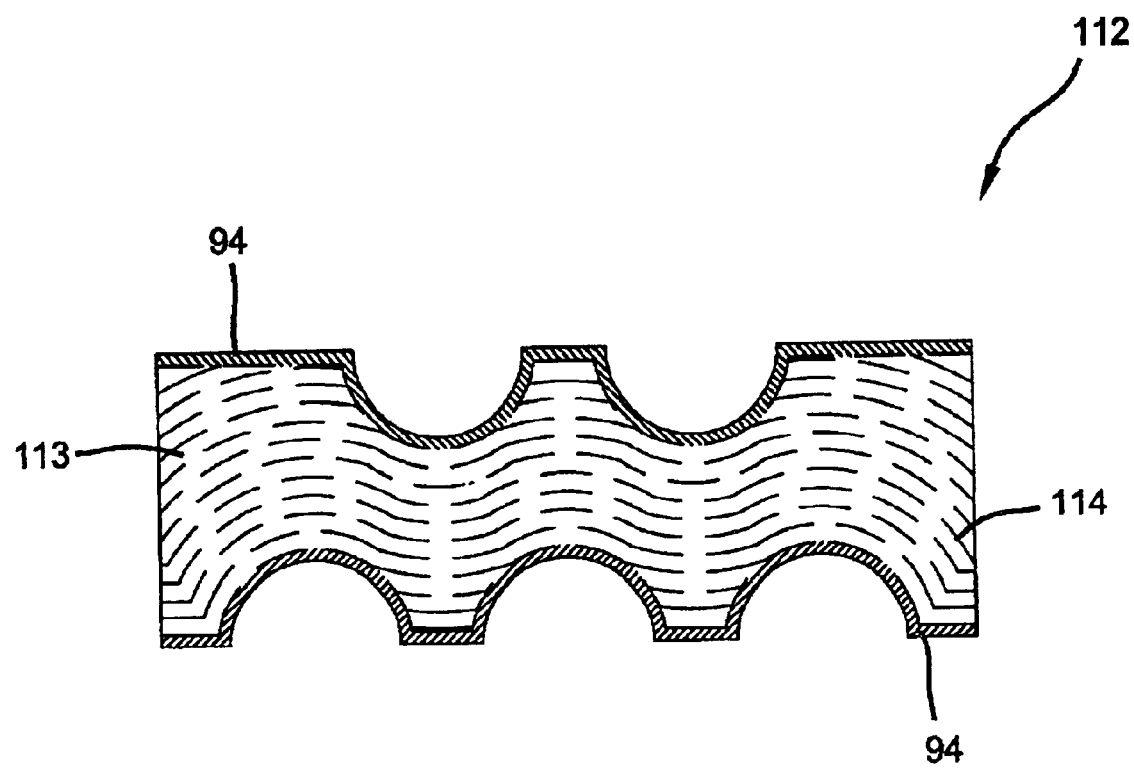
FIG. 7 is a partial cross-section of a bipolar plate made from a composite of electrically conductive particles dispersed in a binder matrix coated with an electrically conductive material.

In a third embodiment, as can be seen in FIG. 7, the electrically conductive coating 94 can be deposited onto another electrically conductive fluid distribution element 112 that includes a polymeric material 113 with a conductive fibrous filler 114 having a through-plane orientation which provides a path of conductivity through the element may be used. This is a composite material. The polymeric material 113 is preferably a suitable thermoset polymer and more preferably selected from the group of material including silicone, poly-isobutylene, epoxy, vinyl ester and phenolic. Alternately, the polymeric material 113 is preferably a suitable thermoplastic and more preferably selected from the group of materials including polypropylene, ethylene tetrafluoro-ethylene (ETFE), nylon and rubber-modified polypropylene. While the foregoing thermoset and thermoplastic polymers containing a conductive fibrous filler are presently preferred, one skilled in the art will readily recognize that other similar materials may also be suitable given the particular design specification of an application. For example, any electrically conductive polymer, such as polyacetylene may be used and does not require a conductive fibrous filler.

In accordance with the third embodiment (FIG. 7), the conductive fibrous filler 114 includes a fiber material having an aspect ratio (i.e., the ratio of length to thickness) of greater than approximately 5:1 and exhibiting good electrical and thermal conductivity characteristics. In this regard, preferred conductive fiber materials presently include carbon fibers (such as pitch-based fibers, PAN-based fiber, or others), graphite fibers, metal-coated graphite fibers (such as gold-coated fibers) and various metal fibers including stainless steel fibers. While the fibrous conductive filler 114 generally has an aspect ratio greater than 5:1, the conductive fibers more preferably have an aspect ratio of greater than 10:1, and most preferably an aspect ratio of greater than 15:1.

In addition to the polymeric material 113 and conductive fibrous filler 114, the composite of the present invention may optionally include a non-conductive fibrous material of 1% to 10% by volume % for enhancing the mechanical properties of the composite material. As presently preferred, the non-conductive fibrous filler may be selected from the group including glass fibers. Similarly, the composite material may include a conductive, non-fibrous material of up to 10% by volume %. As presently preferred, the conductive non-fibrous material may preferably be selected from the group including carbon black, graphite powders and metal-based powders. Examples can be found in the art, for example see U.S. Pat. Nos. 6,096,450, 6,103,413, and 6,248,467. In this embodiment (FIG. 7), the metal coating facilitates electrical conductivity from the composite material to the next adjoined element of the fuel cell.

Figure 8A:
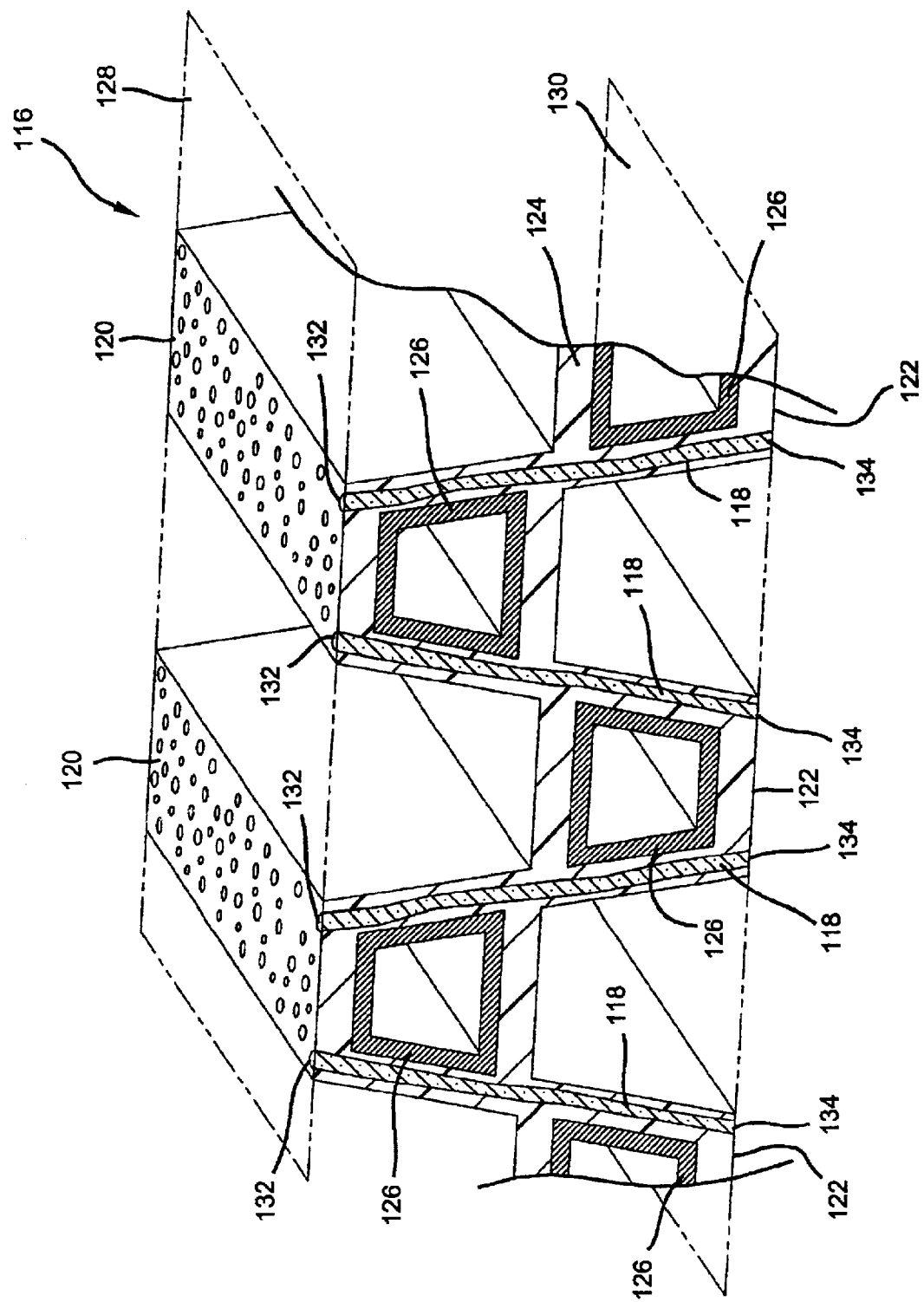
FIG. 8a is a partial cross-section of a bipolar plate made from a composite that contains continuous conductive particles dispersed in a binder matrix.
Figure 8B:
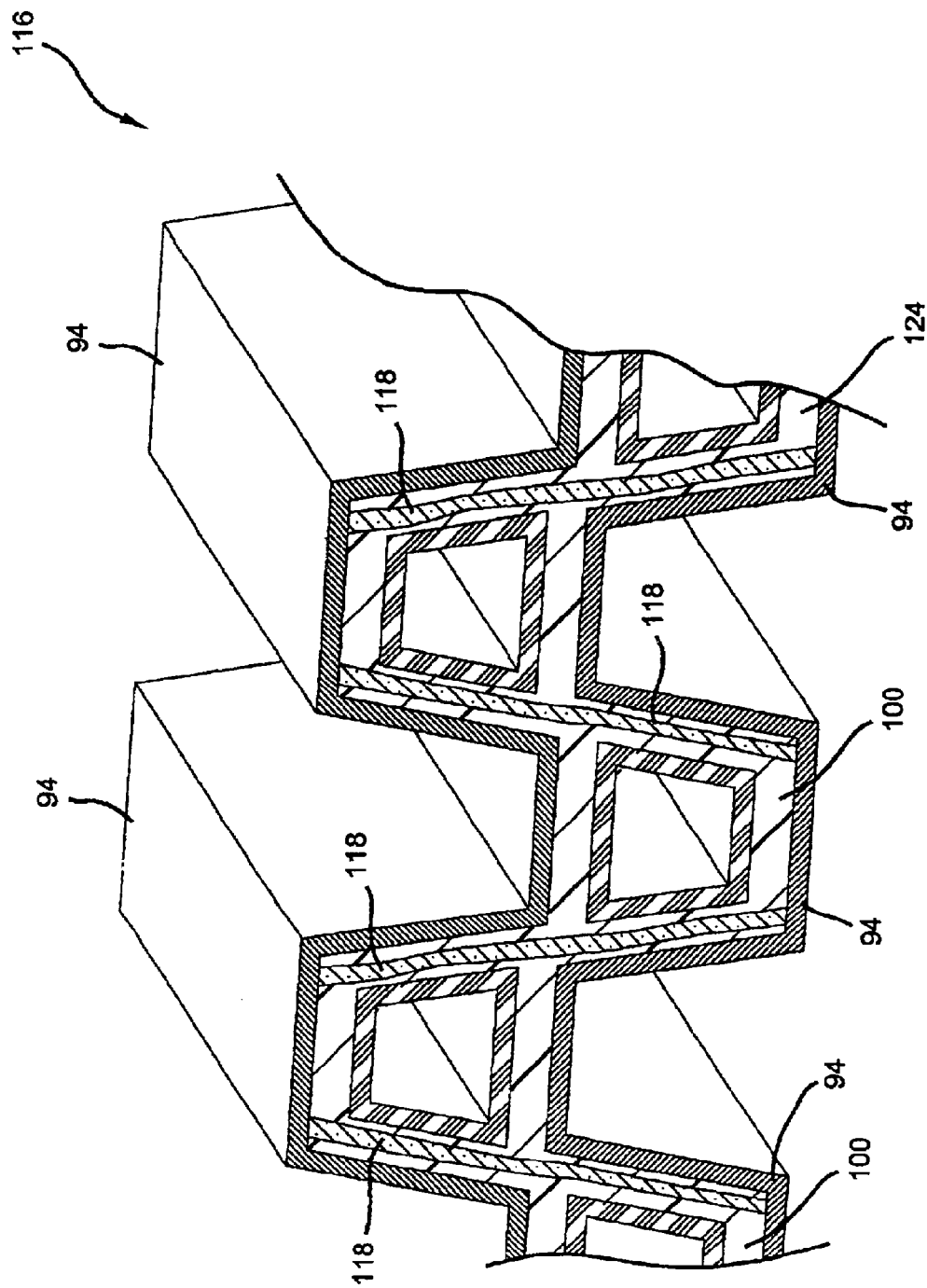
FIG. 8b is a partial cross-section of a bipolar plate as shown in FIG. 8a coated with an electrically conductive material.

In a fourth embodiment, as shown in FIGS. 8a and 8b, the electrically conductive fluid distribution element that may be used is a polymeric bipolar plate 116 that contains a plurality of electrically conductive fibers 118 that are disposed within a polymeric body portion, each fiber 118 extending continuously from the first surface 120 of the polymeric body portion to the second surface 122 of the polymeric body portion in a through plane configuration.

The main body portion 124 is formed of a polymeric material having relatively high strength, suitable thermal properties and low permeation with respect to coolant fluid and reactant gases. Preferably, the main body portion 124 is formed of a toughened, thermally conductive polymer such as carbon filled epoxy. However, the main body portion 124 may be formed of other suitable materials having such desirable properties. For example, the main body portion 124 may be constructed of silicone, poly-isobutylene, poly-vinyl ester, polyester, phenolic, polypropylene, ETFE, nylon or rubber modified polypropylene. The thermal conductivity can be enhanced by loading the polymeric material with carbon, graphite or noble metal particles.

The tubular members 126 disposed within the main body portion 124 of the bipolar plate 116 are operable to define a secondary flow field there-through to pass a cooling fluid through the separator plate for controlling the thermal energy thereof. The tubular members 126 are adapted to pass a cooling fluid through plumbing 70 to remove (or add) thermal energy from (to) the fuel cell stack. The coolant headers which fluidly couple the tubular member 126 to the plumbing should provide electrically insulation therebetween to eliminate shunt current between the fibers 118 and the tubular members 126.

As presently preferred, the tubular members 126 are formed of a carbon-filled polymer. However, it is contemplated that the tubular members 126 may be formed of any of a variety of materials that are thermally conductive and not susceptible to corrosion from exposure to the gaseous reactant or coolants commonly used in a fuel cell stack. Some other suitable materials include titanium, carbon, or stainless steel.

The conductive elements 118 disposed within the separator plate are generally oriented in a through plane orientation and extend continuously from the upper surface 128 of the separator plate to the lower surface 130 of the separator plate for minimizing the bulk resistivity of the plate, as seen in FIG. 8a. Each conductive element 118 is an elongated fiber (i.e.: an aspect ratio of 2000:1 or greater). As can be seen in FIG. 8a, the first end 132 is exposed at the upper surface 128 and the second end 134 is exposed at the lower surface 130.

Now referring to FIG. 8b, the conductive coating 94 has been deposited onto the polymeric bipolar plate 116 such that the conductive elements 118 contact the conductive coating 94. The conductive elements 118 are formed of a carbon based, electrically conductive fiber such as pitch-based fibers, PAN-based fiber, or others. The conductive elements 118 may also be formed of other suitable electrically conductive fibrous materials such as graphite fibers, Au-coated graphite fibers, Pt-coated graphite fibers, Au fibers, Pt fibers or coated stainless steel fibers. In FIGS. 8A and 8B, the conductive elements 118 used in conjunction with the conductive coating 94 enhances electrical conductivity between adjacent bipolar plates.

It will be evident that the application of conductive coating to any combination of surfaces of foam or planar sheet is contemplated and further that coating of the foam to any desired extent throughout its thickness is also contemplated. It will also be evident that in the case of composite or fibrous material the metal coating enhances or at least facilitates electrical conductivity.

A method of depositing the conductive coating 94 onto the bipolar plates of the four embodiments mentioned above will now be described with reference to FIG. 9. In order to deposit the conductive coating 94 onto the substrate, an ion-assisted, physical vapor deposition (PVD) method is employed.

Figure 9:
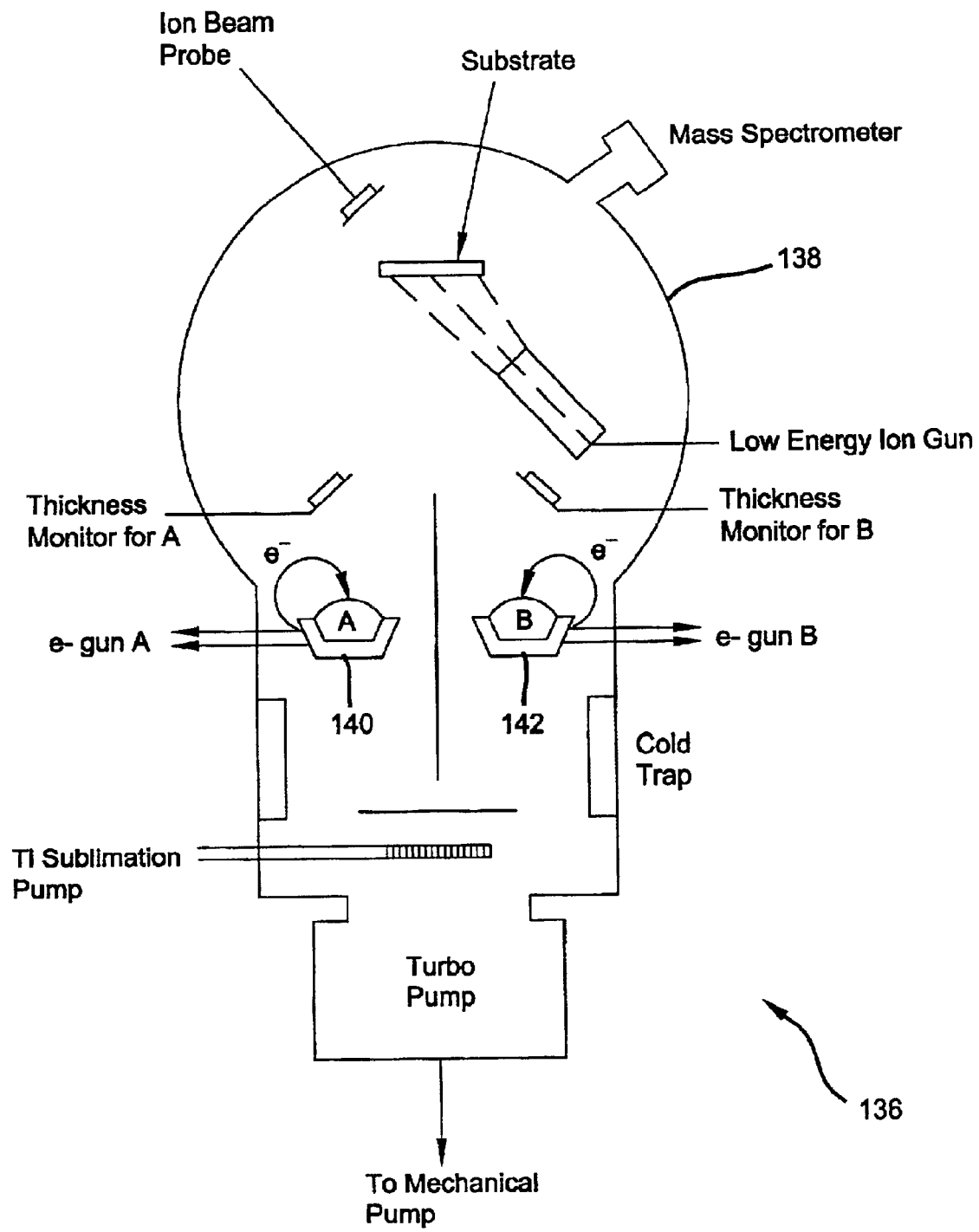
FIG. 9 is an illustration of an ion-beam assisted physical vapor deposition apparatus used to coat the bipolar plates with the electrically conductive material.

As can be seen in FIG. 9, an ion-assisted PVD apparatus 136 is used. The apparatus 136 includes a deposition chamber 138 and two electron guns A and B for deposition of the metal coating. The apparatus 136 also includes a low energy ion gun which is used for sputter cleaning of the substrates, and a turbo pump which allows the apparatus to operated in an ultra-high vacuum.

The substrate to be coated by the conductive coating 94 is placed in the deposition chamber 138. Once the substrate is placed into the chamber 138, the pressure is lowered to about $10^{-4}$ Torr. A first crucible 140 in the chamber holds the noble metal to be deposited. If a combination of metals or noble metals is to be deposited, a second metal is held by a second crucible 142. For example, a crucible 140 containing titanium to be deposited as a first layer and crucible 142 containing gold to be deposited over the titanium as a second layer is not out of the scope of the present invention. Another option available may be to deposit a combination of metals simultaneously.

The ion gun is used to sputter clean the substrate. As the ion gun sputter cleans the substrate, a beam of electrons is used to melt and evaporate the noble metals. The noble metals are then deposited on the substrate at a rate of 0.10 nm/s to a thickness of less than 80 nm, which is observed by thickness monitors.

A unique aspect of the ion-assisted PVD method is that the substrate is sputter cleaned and the conductive coating is deposited essentially simultaneously. By sputter cleaning and coating the substrate simultaneously, the conductive coating 94 may be deposited onto the substrate at ultra-low thicknesses of less than 80 nm, preferably less 50 nm, and most preferably 10–20 nm. When the conductive coating 94 has a thickness of 10–20 nm, the conductive coating preferably has a loading of 0.02–0.04 mg/cm$^2$.

The present process is an improvement over sequential cleaning and depositing. When the substrate used is a metal substrate such as titanium or stainless steel, an oxide film forms in the time between where the cleaning occurs to where physical vapor deposition deposits the metal onto the substrate. By simultaneously cleaning the substrate and depositing the noble metal, the oxide layer is completely and continuously removed thus preventing or at least significantly reducing oxide formation or other fouling of the surface. Simultaneously cleaning the substrate and depositing the noble metal can be accomplished due to the fact that the ion energies required to remove the oxide layer are low. Since the ion energies are low, the bombarding ion fluxes are generally smaller than the depositing atom fluxes that are emitted by the electron guns A and B. This is because oxides being removed are lighter than the metal being deposited onto the substrate as conductive coating 94. As such, the low energy ion gun removes only the oxide layer and not the conductive coating 94. The result is that a coating 94 of metal is deposited having excellent adhesion to the substrate. Further it is possible to coat only a very thin layer, on the order of 10–20 nm, thereby achieving good surface coverage, relatively uniform coverage, and good adhesion. Thus, the use of ion-assisted, PVD allows the noble metal to be deposited on the substrate very smoothly, evenly, and in a thin layer.

It should be understood that an important feature of the invention is the deposition of a metal coating on an essentially clean surface. In a preferred aspect, the ion gun surface cleaning of the substrate is commenced just before the metal deposition is initiated. Then, the cleaning and metal deposition proceed simultaneously to completion of the deposition process.

As stated above, by depositing the metal coating onto a clean surface, the coating's adhesion is greatly improved, and thus resists delamination from the substrate. For example, when a coating is subjected to cycles of an applied cathodic current ranging from 10 mA/cm$^2$–50 mA/cm$^2$ in a solution of 0.5 M $H_2SO_4$, hydrogen gas ($H_2$) is evolved which causes prior art coatings to delaminate or peel, from the substrate. However, when the coating is deposited by the ion-assisted, PVD method of the present invention, the coating's excellent adhesion to the clean surface of the substrate resists the delamination from the substrate caused by the evolved $H_2$ when the cathodic current is applied.

It should also be understood that the use of ion-assisted, PVD is an improvement over prior deposition methods such as the sputtering of Au. This is because the control of plasma in sputtering is haphazard since the direction, energy and flux of ions incident on the substrate cannot be regulated. In contrast, ion-assisted PVD provides independent control of the deposition parameters due to the fact that the ion beams used in ion-assisted, PVD have low energy and are well collimated, with divergence angles of only a few degrees.

Experimental details regarding a preferred embodiment of the present invention will now be described in detail. In this preferred embodiment, gold is chosen as the noble metal to be deposited onto a 316L stainless steel substrate by ion-assisted PVD.

In a first series of experiments, gold was deposited onto stainless steel substrates by electron beam evaporation in an ultrahigh vacuum. The stainless steel substrates were cleaned using on an ultrasonic bath, first with acetone and then with methanol for 15 minutes each. The gold coating was found to have very poor adhesion.

In a second series of experiments, the stainless steel substrate was sandblasted and then cleaned using the ultrasonic bath of acetone and then methanol prior to the deposition of gold onto the substrate. Adhesion was improved, however, the coating failed upon being placed in a corrosion test solution.

In a third series of experiments, the stainless steel substrate was electrochemically cleaned prior to being placed into the ultrasonic bath of acetone and then methanol. Once more, the adhesion of the gold improved, but the coating failed upon being placed into a corrosion test solution.

In a fourth series of experiments, the ion-assisted, PVD method of the present invention was employed. The ion gun that was used was a 100 to 500 eV $Ar^+$ beam with a current density of 1 to 20 mA/cm$^2$ for 2 to 10 minutes. The evaporation source material was 99.99% pure gold from Johnson-Matthey. The 316L stainless steel substrates used were 1"×1" coupons that were first cleaned in an ultrasonic bath of acetone, then methanol for 15 minutes each. The stainless steel substrates were then loaded into the deposition chamber of the ion-assisted PVD apparatus and held there until the pressure was less than $2\times10^{-7}$ Torr. The base pressure of the deposition chamber was typically in the mid $10^{-9}$ Torr range and always lower than $1\times10^{-8}$ Torr. As the ion gun cleaned the stainless steel substrate, a gold coating was deposited with the single electron beam evaporation source at a rate of 0.10 nm/s at a temperature of 35 degrees centigrade to 40 degrees centigrade. The gold coatings showed excellent adhesion, even after being placed in a corrosion test solution for almost 100 hours.

When compared to prior art deposition techniques such as electroplating, the present invention provides distinct advantages. For example, the deposition of noble metals by electroplating onto a substrate is very costly. This is due to the fact that a thick coating of about 100 nm or more is what is needed to prevent corrosion of the substrate when a metal substrate such as stainless steel, aluminum, or titanium is used. Furthermore, when electroplating is used, the adhesion of the noble metal to the substrate is poor. Therefore, in order to improve adhesion, an interlayer of another metal such as nickel is used. This further adds to the manufacturing costs in addition to being unstable in the fuel cell environment. By using the ion-assisted method of the present invention, no interlayer is needed and a low thickness of only 10–20 nm can be utilized, thereby cutting manufacturing costs.

Still furthermore, referring to FIGS. 10a and 10b, when an ion-assisted, PVD method is used, a smooth and even coating of metal can be deposited onto the substrate (FIG. 10a). When a smooth and even surface is deposited onto the substrate, it prevents corrosion. In contrast, an electroplated coating is rough and porous (FIG. 10b). The electroplated coating contains many peaks and valleys that do not ensure that the entire substrate is coated which will, in turn, lead to corrosion of the substrate. These many peaks and valleys also will not ensure electrical contact in the valleys. Furthermore, an oxide may still be present in the valleys which may contaminate the fuel cell. This is more clearly depicted in FIGS. 11a and 11b.

FIGS. 11a depicts an Atomic Force Microscopy image of a gold coating produced by the ion-assisted, PVD method of the present invention. As can be seen in FIG. 11a, the coating is smooth and even. A roughness analysis as well as a peak-to-valley range analysis were also performed. The mean roughness ($R_a$) of the ion-assisted, PVD coating was only 184.78 nm and the peak-to-valley range (Z) was only 1.119 micrometers. The peak-to-valley range should be less than 3.000 micrometers, desirably less than 2.800 micrometers, more desirably less than 2.500 micrometers, preferably less than 2.000 micrometers, and most preferably less than 1.500 micrometers. By having such a smooth and even surface, the coating of the present invention ensures that electrical contact between bipolar plates will be maintained. Also, the smooth and even surface ensures that any oxide that was not completely removed by the ion-assisted PVD method will be thoroughly coated and prevented from contaminating the fuel cell.

In contrast, as can be seen in FIG. 11b, an Atomic Force Microscopy image of an electroplated coating shows that the coating is rough and porous. Many protruding nodules are present. The roughness analysis and peak-to-valley range of the electroplated coating show a mean roughness ($R_a$) of 415.88 nm and a peak-to-valley range (Z) of 2.860 micrometers. As such, the many peaks and valleys of the electroplated coating will not ensure electrical contact between bipolar plates. The electroplated coating also does not ensure that all of the oxide has been removed or coated, which will contaminate the fuel cell.

Still another advantage of the present invention is, as described above and in the first embodiment, the optional coating of the inside surfaces 90 and 92 of sheets 58 and 60 (FIG. 2) to ensure that electrical contact between sheets 58 and 60 will be maintained. Typically, sheets 58 and 60 are bonded together by an adhesive (not shown). When such an adhesive is used, however, a coolant that may be used between sheets 58 and 60 may attack the integrity of the adhesive and cause a significant increase in resistance between the sheets 58 and 60. By coating the inside surfaces 90 and 92 of sheets 58 and 60 with the conductive coating 94 of the present invention, the resistance between sheets 58 and 60 can be kept to a minimum for extended durations of time.

This advantage of the present invention was tested by placing a bipolar plate bonded by an adhesive into a deionized water bath at 80 degrees Celsius. The bipolar plate, even after 5000 hours, exhibited a minimum resistance between the sheets 58 and 60. This is a result of the coating 94 having an excellent adherence to the adhesive, as well as facilitating excellent electrical conductance between sheets 58 and 60.

Figure 12:
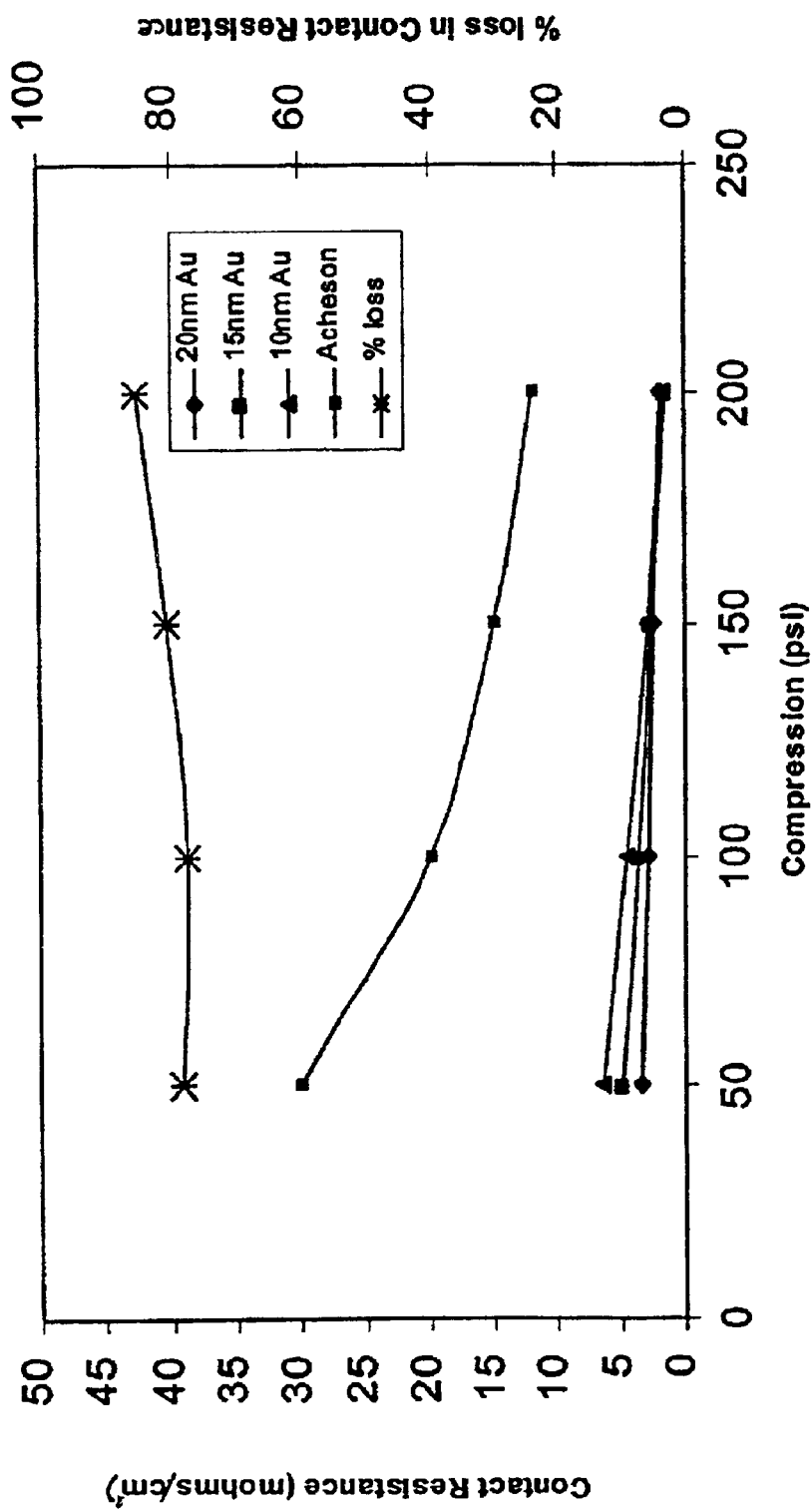
FIG. 12 is a graph portraying a contact resistance achieved by the electrically conductive coating of the present invention as well as a prior art coating.

Yet another advantage of using an ion-assisted PVD deposited noble metal coating is that there is a low variation in contact resistance with compression pressure as compared to a commercially known coating such as Acheson. This is illustrated in FIG. 12. The samples tested were 20 nm Au, 15 nm Au, and 10 nm Au on stainless steel substrates. Acheson (a conductive carbon based coating obtained from Acheson Corp.) was coated onto a titanium substrate. The contact resistance was measured by compressing the samples in between two diffusion papers from Toray. Pressures were varied between 50–200 psi while a current of 1 A/cm$^2$ was applied. The contact resistances were obtained by measuring the voltage drop between the diffusion papers and the metal samples across the coating. As can be seen in FIG. 12, 10 nm, 15 nm, and 20 nm gold coatings generate very low contact resistances over a wide compression range of 50–200 psi. Specifically, the contact resistance typically has a value between 1.5 and 6.5 milliohms/cm$^2$ with a very low percent loss over the 50–200 psi pressure range. The Acheson coating, on the other hand, has a contact resistance between 12 and 31 milliohms/cm$^2$ with a considerable percent loss over the 50–200 psi pressure range. The low contact resistance of the present invention allows low stack pressures to be employed for the fuel cell stack which will, in turn, lengthen the life span of the stack as well as prevent fiber impingement of the MEA.

The effects of the present invention on contact resistance and cell voltage are also shown in FIG. 13. FIG. 13 is a graph depicting a comparison of a 317L stainless steel substrate coated with 10 nm Au in accordance with the present invention, an uncoated 317L stainless steel substrate, and a Poco graphite substrate. As can be seen in FIG. 13, the electrically conductive coating of the present invention provides a distinct advantage in cell voltage and contact resistance over an uncoated stainless steel substrate. In comparison to a Poco graphite substrate, the electrically conductive coating of the present invention provides a cell voltage substantially the same, while providing a lower contact resistance. As such, the electrically conductive coating of the present invention provides an overall advantage over Poco graphite in that the overall cost to produce a stainless steel substrate coated with the electrically conductive coating of the present invention is less.

Still another advantage of the present invention is the conductive coating preventing passivation of the bipolar plates. As can be seen in FIG. 14, a stainless steel substrate coated with 10 nm Au enabled low corrosion currents while cycling the potential between +0.4 and +0.6 V (vs. Ag/AgCl) in aerated solution at 80 degrees centigrade, thereby simulating a bipolar plate environment in a fuel cell (pH=3.0, 10 ppm HF, and 0.5 M Na$_2$SO$_4$ as the supporting electrolyte).

Potentiostatic corrosion experiments were also conducted over 100 hours at both +0.6 V (vs. Ag/AgCl) in air and at −0.4 V (Ag/AgCl) in hydrogen for a stainless steel substrate coated with 10 nm Au. As can be seen in FIG. 15, the measured corrosion currents under these conditions were significantly low (below 1 microamp/cm$^2$), indicating good stability of the coating.

As can be seen from the foregoing detailed description, the present invention provides an ultra-thin conductive coating formed from a noble metal that sufficiently covers the surface of a substrate to prevent corrosion and provides a low contact resistance for an electrically conductive fluid distribution element which improves the overall performance of a fuel cell. Furthermore, as a result of the coating being coated with an ultra-low loading of a noble metal, the manufacturing cost of preparing an electrically conductive fluid distribution element is kept to a minimum.

The description of the above embodiments and method is merely exemplary in nature and, thus, variations that do not depart from the gist of the invention are intended to be within the scope of the invention. Such variations are not to be regarded as a departure from the spirit and scope of the invention.

What is claimed is:

1. A method for manufacturing an electrically conductive fluid distribution element, comprising the steps of:
    providing a substrate;
    cleaning said substrate with an ion beam; and
    depositing an electrically conductive coating on said substrate by physical vapor deposition to a thickness of less than 100 nm,
    wherein
        said cleaning and said depositing are conducted essentially simultaneously; and
        said cleaning comprises removing an oxide layer from said substrate.

2. The method of claim 1, wherein said cleaning is initiated prior to said depositing and said cleaning continues during said depositing.

3. The method of claim 1 further comprising continuing said cleaning of said substrate at least until said depositing is terminated.

4. The method of claim 3 wherein said cleaning is terminated after said depositing is terminated.

5. The method of claim 1, wherein said coating is deposited to a thickness of less than 80 nm.

6. The method of claim 1, wherein said coating has a thickness of 10–20 nm.

7. A method for manufacturing an electrically conductive fluid distribution element, comprising the steps of:
    providing a substrate;
    cleaning said substrate with an ion beam; and
    depositing an electrically conductive coating on said substrate by physical vapor deposition to a thickness of less than 100 nm, wherein:
said cleaning and said depositing are conducted essentially simultaneously; and
said electrically conductive coating is deposited to loading of 0.02 to 0.04 mg/cm$^2$.

8. The method of claim 1, wherein said substrate is selected from the group consisting of stainless steel, aluminum, and titanium.

9. The method of claim 1, wherein said coating comprises a noble metal.

10. The method of claim 9, wherein said noble metal is selected from the group consisting of Ru, Rh, Pd, Ag, Au, Ir, Pt, Os, and combinations thereof.

11. A method for manufacturing an electrically conductive fluid distribution element, comprising the steps of:
providing a substrate;
cleaning said substrate with an ion beam; and
depositing an electrically conductive coating on said substrate by physical vapor deposition to a thickness of less than 100 nm,
wherein:
said cleaning and said depositing are conducted essentially simultaneously; and
said coating has a contact resistance of 1.5–6.5 milliohms/cm$^2$.

12. The method according to claim 1, wherein said coating comprises a corrosive-resistant coating.

13. The method according to claim 1, wherein said coating is deposited at a rate of 0.10 nm/s.

14. An electrically conductive fluid distribution element comprising:
a metal substrate; and
an electrically conductive coating disposed on said substrate,
wherein:
said coating has a thickness of less than 80 nm; and
said electrically conductive coating has a loading of 0.02–0.04 mg/cm$^2$.

15. An electrically conductive fluid distribution element comprising:
a metal substrate; and
an electrically conductive coating disposed on said substrate,
wherein:
said coating has a thickness of less than 80 nm; an
an outer layer of said coating comprises a noble metal or mixture of noble metals and said coating further comprises an intermediate metal layer of a non-noble corrosive-resistant metal disposed between said substrate and said outer layer; wherein said coating has a smooth surface characterized by a peak-to-valley range of less than 2.5 micrometers.

16. The element of claim 15, wherein said coating has a contact resistance of 1.5–6.5 milliohms/cm$^2$.

17. The element of claim 16, wherein said substrate is selected from a group consisting of stainless steel, aluminum, and titanium.

18. A fuel cell comprising an electrically conductive fluid distribution element and a membrane electrode assembly;
said membrane electrode assembly including a polymer electrolyte having an anode on one face of said membrane electrolyte and a cathode on an opposite face of said membrane electrolyte; and
said element comprising:
an electrically conductive polymeric substrate; and
an electrically conductive coating disposed on said substrate,
wherein said coating has a thickness of less than 100 nm.

19. A fuel cell comprising an electrically conductive fluid distribution element and a membrane electrode assembly;
said membrane electrode assembly including a polymer electrolyte having an anode on one face of said membrane electrolyte and a cathode on an opposite face of said membrane electrolyte; and
said element comprising:
a conductive foam having external surfaces and internal openings forming through passages through said foam for fluid distribution; and
an electrically conductive metal coating on such external surfaces and optionally on said internal openings, wherein said coating has a thickness of less than 100 nm.

20. The element of claim 18, wherein said polymeric substrate is a composite which comprises a polymer and a conductive filler dispersed in said polymer.

21. The element of claim 20, wherein conductive filler is selected from the group consisting of carbon fibers, graphite fiber, nickel-coated graphite fibers, stainless steel fibers, and combinations thereof.

22. The element of claim 20, wherein said polymer is selected from the group consisting of silicone, polyisobutylene, epoxy, vinyl ester, phenolic, polypropylene, ethylene tetrafluoro-ethylene, nylon, rubber modified polypropylene, and mixtures thereof.

23. The element of claim 18, wherein said coating comprises a noble metal selected from the group consisting of Ru, Rh, Pd, Au, Ag, Ir, Pt, Os, and combinations thereof.

24. The element of claim 19, wherein said coating comprises a noble metal selected from the group consisting of Ru, Rh, Pd, Ag, Au, Ir, Pt, Os, and combinations thereof.

25. The element of claim 19, wherein said foam is selected from the group consisting of stainless steel, nickel, aluminum, titanium, and carbon.

26. A method for manufacturing an electrically conductive element, comprising:
providing a substrate;
cleaning said substrate with an ion beam; and
depositing an electrically conductive coating on said substrate by physical vapor deposition to a thickness of less than 100 nm,
wherein:
said cleaning and said depositing are conducted essentially simultaneously; and
said cleaning comprises removing an oxide from said substrate.

27. An electrically conductive element comprising:
an electrically conductive substrate having a surface containing a plurality of grooves and lands, and an electrically conductive coating disposed on said substrate overlying at least said lands,
wherein at least one of the following apply:
(a) said coating has a thickness of less than 100 nm;
(b) said electrically conductive coating has a loading of 0.02–0.04 mg/cm$^2$.

* * * * *